US010588247B2

(12) United States Patent
Torrisi et al.

(10) Patent No.: US 10,588,247 B2
(45) Date of Patent: Mar. 10, 2020

(54) CIRCUIT FOR THERMAL PROTECTION AND METHOD OF OPERATION THEREOF

(71) Applicant: STMicroelectronics S.r.l., Agrate Brianza (IT)

(72) Inventors: Giovanni Luca Torrisi, Catania (IT); Domenico Porto, Catania (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 101 days.

(21) Appl. No.: 15/797,889

(22) Filed: Oct. 30, 2017

(65) Prior Publication Data

US 2018/0249597 A1 Aug. 30, 2018

(30) Foreign Application Priority Data

Feb. 28, 2017 (IT) .................. 102017000022534

(51) Int. Cl.
| | |
|---|---|
| H05K 7/20 | (2006.01) |
| G06F 1/3287 | (2019.01) |
| G06F 1/3206 | (2019.01) |
| G06F 1/20 | (2006.01) |
| G06F 1/30 | (2006.01) |
| G06F 1/3234 | (2019.01) |

(52) U.S. Cl.
CPC ......... *H05K 7/20945* (2013.01); *G06F 1/206* (2013.01); *G06F 1/305* (2013.01); *G06F 1/3206* (2013.01); *G06F 1/3243* (2013.01); *G06F 1/3287* (2013.01); *Y02D 10/16* (2018.01); *Y02D 10/171* (2018.01)

(58) Field of Classification Search
CPC ... H05K 7/20945; G06F 1/3243; G06F 1/305; G06F 1/3287; G06F 1/3206; G06F 1/206; Y02D 10/171; Y02D 10/16
See application file for complete search history.

(56) References Cited

U.S. PATENT DOCUMENTS

| | | | |
|---|---|---|---|
| 2006/0013281 A1 | 1/2006 | Sri-Jayantha et al. | |
| 2012/0209559 A1* | 8/2012 | Brower | G06F 1/206 702/130 |
| 2012/0272086 A1* | 10/2012 | Anderson | G06F 1/206 713/340 |
| 2015/0208557 A1 | 7/2015 | Porto et al. | |

* cited by examiner

*Primary Examiner* — Jared Fureman
*Assistant Examiner* — Michael J Warmflash
(74) *Attorney, Agent, or Firm* — Slater Matsil, LLP

(57) ABSTRACT

An embodiment circuit includes a plurality of heat-generating circuits, a heat-sensitive circuit exposed to heat generated during operation of the plurality of heat-generating circuit, and a temperature sensor disposed at a location between the heat-sensitive circuit and the plurality of heat-generating circuits, the temperature sensor being configured to generate an over-temperature signal as a function of temperature sensed at the location. The plurality of heat-generating circuits may be selectively deactivatable in an ordered sequence based on deactivation weights respectively assigned to the plurality of heat-generating circuits and in response to the over-temperature signal.

20 Claims, 6 Drawing Sheets

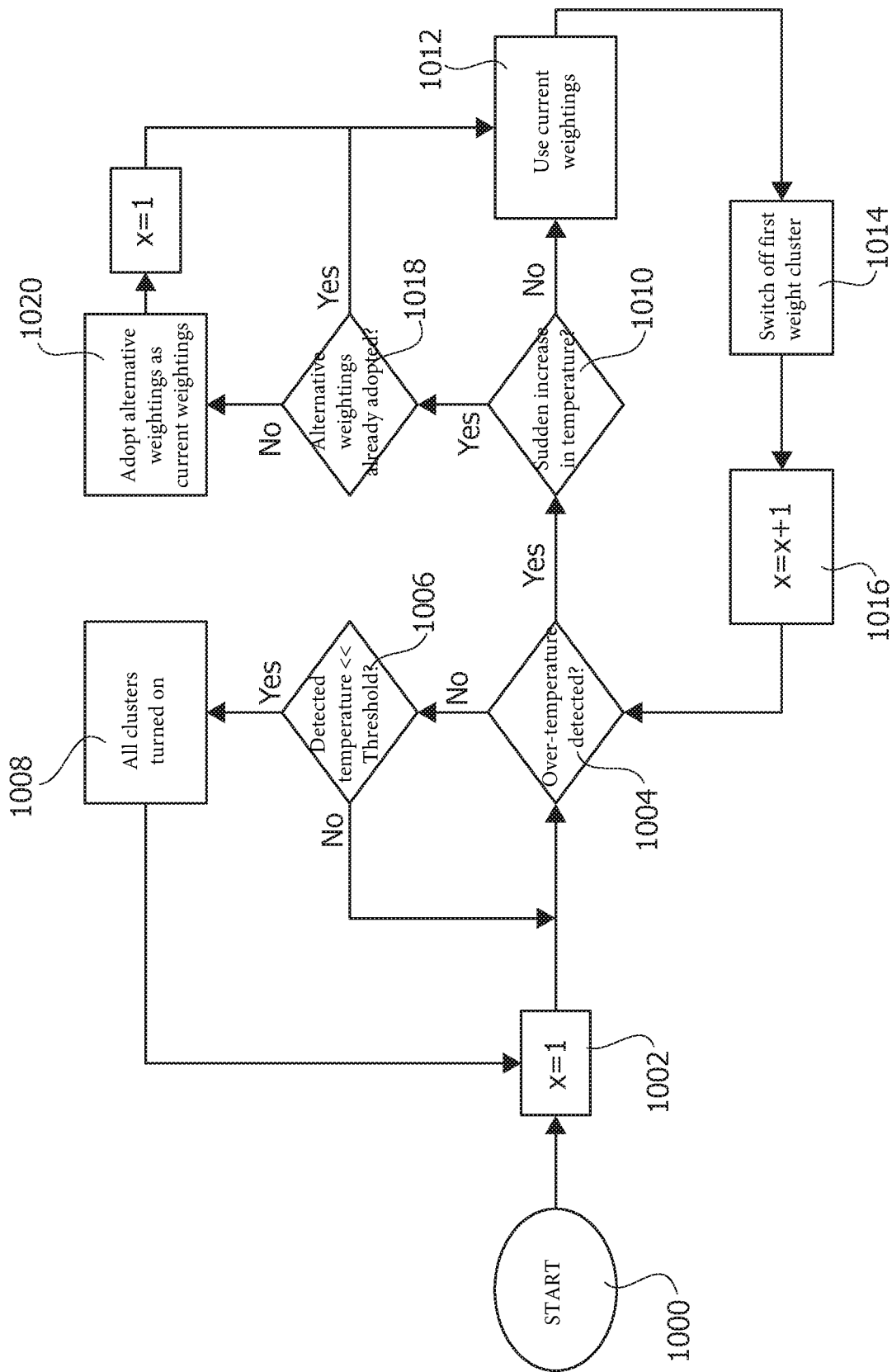

CIRCUIT FOR THERMAL PROTECTION AND METHOD OF OPERATION THEREOF

CROSS-REFERENCE TO RELATED APPLICATIONS

This application claims priority to Italian Application No. 102017000022534, filed on Feb. 28, 2017, which application is hereby incorporated herein by reference.

TECHNICAL FIELD

The description relates generally to thermal protection of electronic devices, and in particular embodiments to a circuit for thermal protection and a method of operation thereof.

BACKGROUND

Thermal-shutdown protection may facilitate preventing damage in semiconductor devices e.g. in the junction region due to prolonged operation at high temperatures. For instance, reliable and continuous operation of integrated circuits may be facilitated by junction temperatures in a chip not exceeding values of e.g. 150° C.

Thermal-shutdown sensors may be integrated in a semiconductor device with the capability of sensing chip temperature and automatically produce power shut-off, e.g. until chip temperature returns to a level considered to be safe.

In certain devices including sensitive circuits (e.g. microcontrollers or logical circuits that control circuits in a chip such as driver, core, oscillator or memory circuits and the like) thermal-shutdown may occur and interrupt operation before e.g. a core is in a position to detect an event leading to high temperature dissipation. Also, the sensitive circuit may be undesirably exposed to high temperatures.

In certain applications, a circuit, such as a CPU, may be housed in a separate package, so that thermal dissipation is unlikely to affect processor performance. However, an e.g. embedded CPU may be shut-off (and possibly damaged) as a result of high power dissipation from other (e.g. internal) outputs. Device logic may be corrupted, with a control circuit such as a microcontroller prevented from achieving a safe condition as a consequence of being "off".

U.S. patent publication 2015/0208557 A1 discloses a method for independent shut-off of a subset of power stages. Such an arrangement includes thermal sensors associated to functional "clusters", with the capability of avoiding a complete shut-off of the device by keeping active (only) those functions which are not affected by a thermal event.

While providing a satisfactory degree of operation, it is felt that such an arrangement may be further improved e.g. by avoiding that an embedded CPU may be undesirably damaged as a result of a temperature increase caused by high power dissipation by other junctions (e.g. device outputs) in the same chip.

SUMMARY

One or more embodiments may be applied to the thermal protection of semiconductor devices, e.g., for applications in the automotive area.

One or more embodiments contribute in providing improved thermal-shutdown protection.

One or more embodiments may implement a sort of "thermal shield" concept in a set of thermally weighted clusters.

One or more embodiments may facilitate protecting a certain device and/or a circuit (e.g., a microcontroller, an oscillator or the like) from a sudden temperature increase.

One or more embodiments may provide a solution for multi-system chips (where, e.g., shutdown priorities can be assigned depending on applications).

One or more embodiments may facilitate achieving a judicious trade-off between various functionalities and CPU safety.

In one or more embodiments, in a design phase, the number of thermal sensors included in a shield arrangement can be either decreased (thus saving die area) or increased (thus improving spatial "granularity").

One or more embodiments may provide an effective thermal safety solution for e.g. multisystem chips including CPU's.

One or more embodiments may facilitate achieving satisfactory performance levels along with thermal safety in smart power devices including CPU's.

Possible adoption of one or more embodiments may be detected e.g. by checking whether the outputs of a certain circuit/device are grouped in different clusters, by forcing a temperature increase on different outputs, e.g., by submitting an overload on different channels and monitoring the ensuing thermal protection behavior.

BRIEF DESCRIPTION OF THE DRAWINGS

One or more embodiments will now be described, by way of example only, with reference to the annexed figures, wherein:

FIG. 8 is a flow chart exemplary of possible operation of one and more embodiments.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
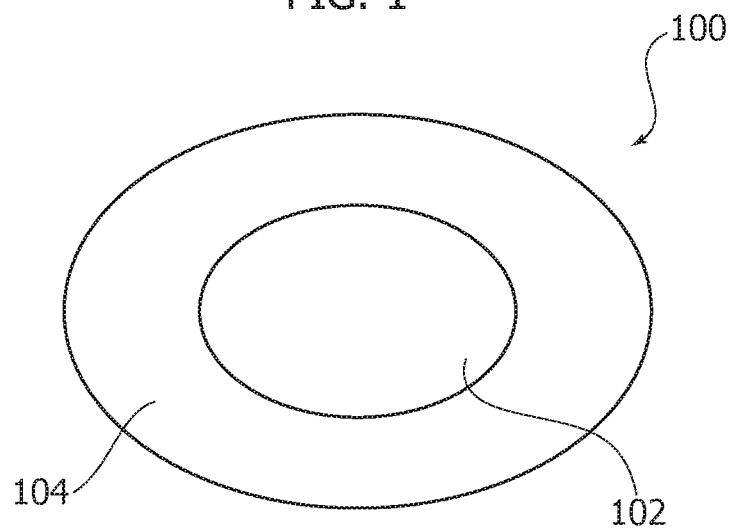
FIG. 1 is a schematic representation of a semiconductor device arrangement.

FIG. 1 is generally exemplary of the possible general layout of a semiconductor device 100 wherein different (e.g., two) temperature domains may be identified. For instance, the device 100 may include a first domain 102 including, e.g., CPU circuitry (adapted to perform a microcontroller and data processing functions), and a second domain 104 which may extend, e.g., around the first domain 102. It will be appreciated that such a layout is considered merely for exemplary purposes with no limiting effects on embodiments. Such arrangements are otherwise well known in the art thus making it unnecessary to provide a detailed description herein.

The first (e.g., CPU) domain 102 may include various circuits such as memory, computation, conversion circuits, and so on as well as communication interfaces.

The second domain 104 may include, e.g., power outputs and voltage regulators as possibly included in a so-called Body Smart Power (BSP) device. A power device for Door Zone plus Power Management in the automotive area may be exemplary of such a smart power device.

A feasible/recommended temperature range for the first temperature domain 102 may be, e.g., −40° C. to 125° C. with an (internal) acceptable increase not in excess of, e.g., 25° C. The second temperature domain 104 may be considered for continuous operation up to, e.g., 185° C. with higher temperatures (e.g. in excess of 250° C.) acceptable locally over a limited duration in time.

It will be appreciated that quantitative data provided in the foregoing are merely exemplary and have no limiting effects on the embodiments. Also, while two thermal domains 102, 104 are considered for exemplary purposes, one or more embodiments may include a higher number of thermal domains.

Figure 2:
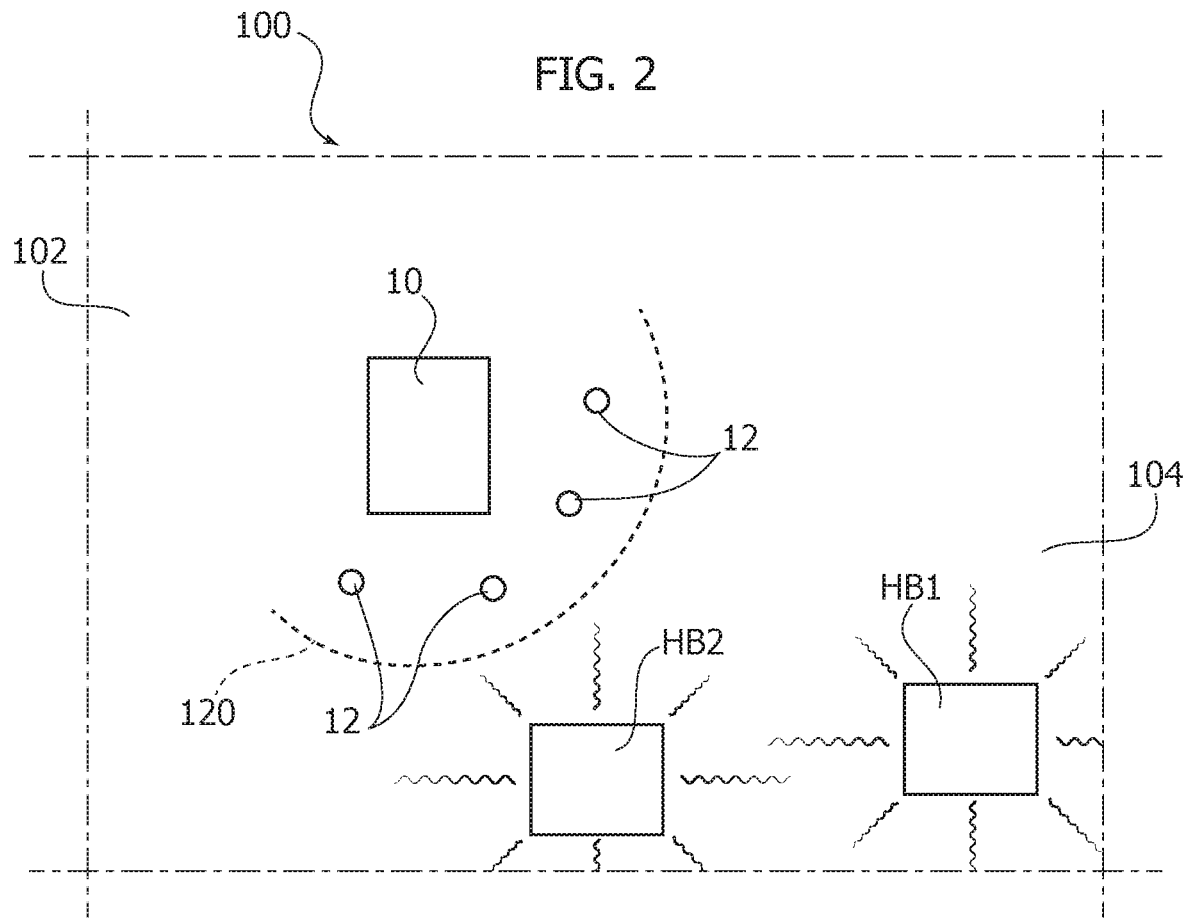
FIGS. 2 to 4 are exemplary representations of a possible behavior of an arrangement as exemplified in FIG. 1.
Figure 3:
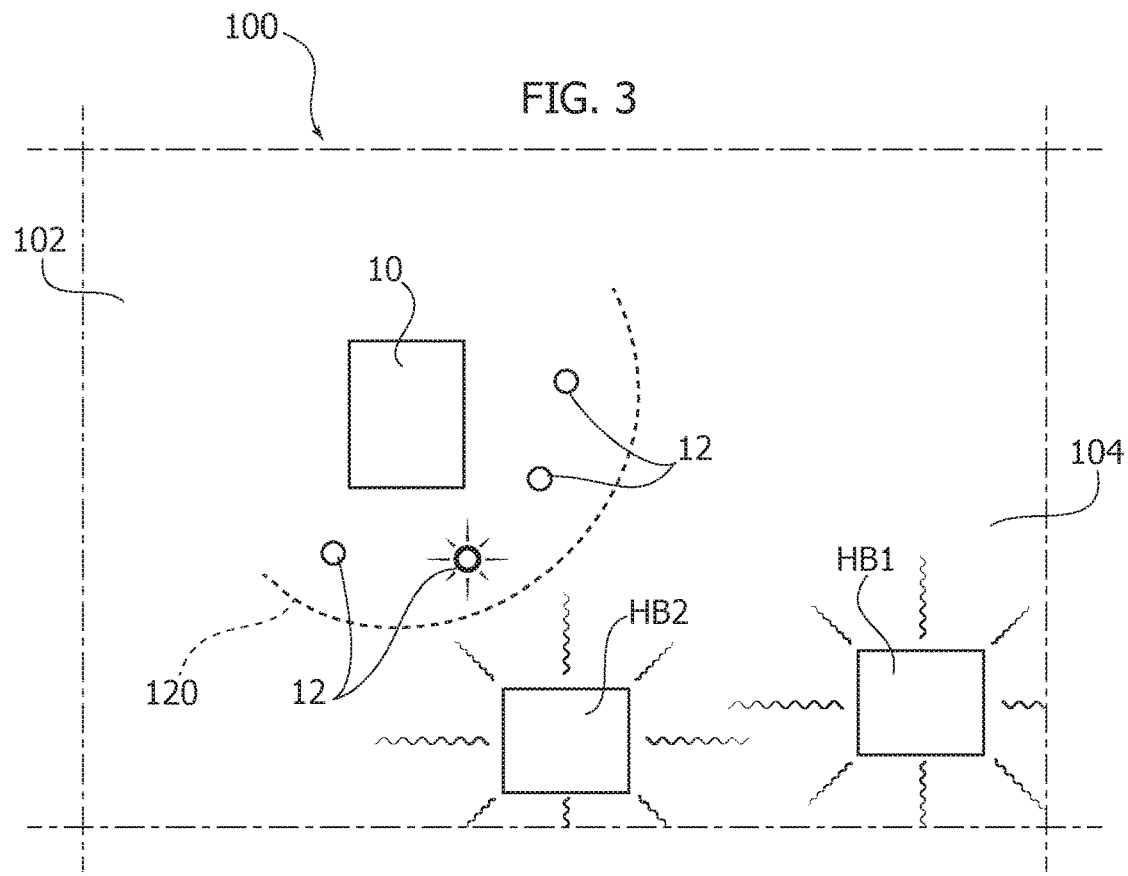
Figure 4:
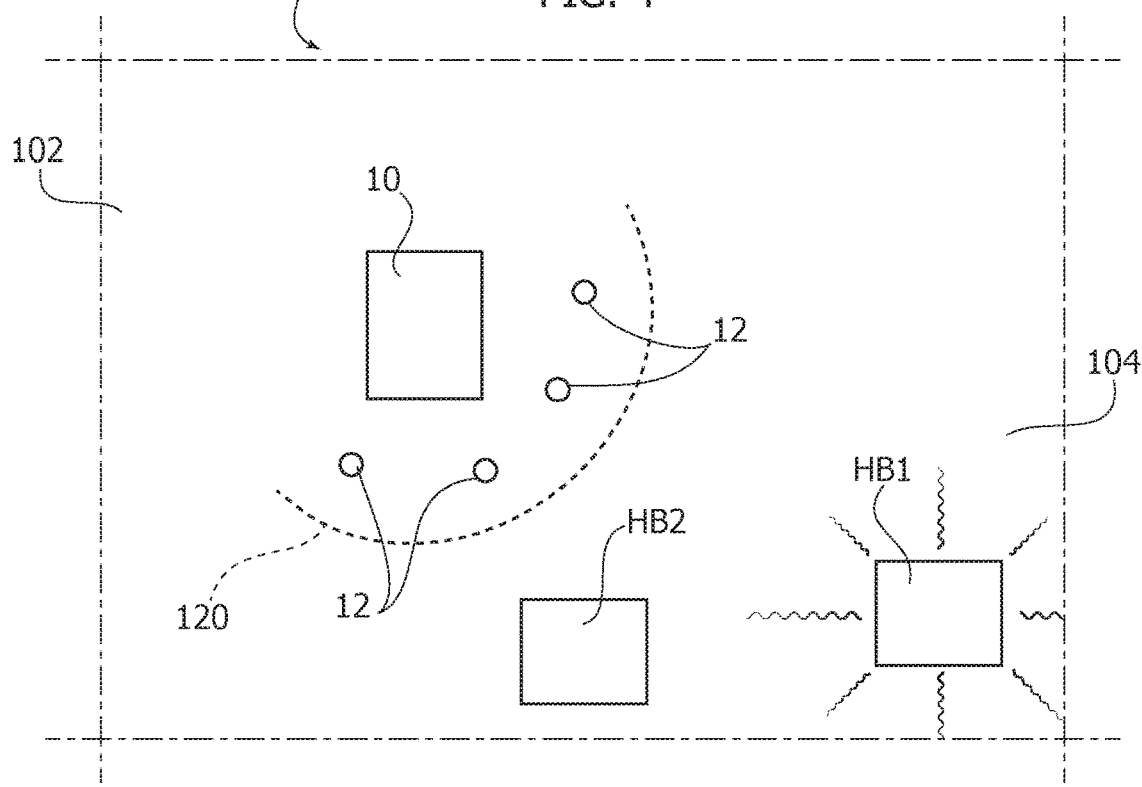

FIGS. 2 to 4 are representative of a generic portion of a circuit 100 where a heat-sensitive circuit 10 (e.g., an embedded CPU) to be protected from excess heat is shown located at a certain portion (e.g., the "coldest" portion of a semiconductor die in a device 100, if compatible with device layout) with an array of associated thermal sensors 12 which may be regarded as forming a sort of notional "shield" along a border line 120 extending between the CPU 10 and possible sources of thermal dissipation HB1, HB2.

While two sources HB1, HB2 are shown in the drawing for exemplary purposes, these sources may be in any number. Also, while four sensors 12 are shown in the drawing for exemplary purposes, the sensors 12 may be in any number.

In one or more embodiments, the number of sensors may be selected as a function of a specific application (e.g., the number and/or location of the sources HB1, HB2, . . . ) with a smaller number of sensors 12 permitting to save semiconductor die area while a higher number of sensors 12 facilitates achieving a higher "granularity" in thermal detection.

The representation of FIG. 3 is schematically exemplary of one of the sensors 12 in the shield 120 (e.g. the second from left as highlighted) detecting a "high" temperature (e.g. an over-temperature in excess of a certain—possibly adjustable—safety threshold) being reached close to the circuit 10 to be protected.

In one or more embodiments, when an abnormal temperature is detected by one (or more) sensor 12 in the shield, the possibility exists of triggering an automatic shut-off procedure of the sources of heat leading to the temperature increase detected (e.g. HB2) so that the CPU 10 may be maintained at a temperature acceptable for operation.

Such an approach is schematically represented in FIG. 4 wherein the source of heat HB2 is shut-off after (at least) one of the sensors 12 in the thermal shield 120 has reached a certain temperature, so that (in the situation schematically represented in FIG. 4) only the heat source HB1 is maintained in operation.

Figure 5:
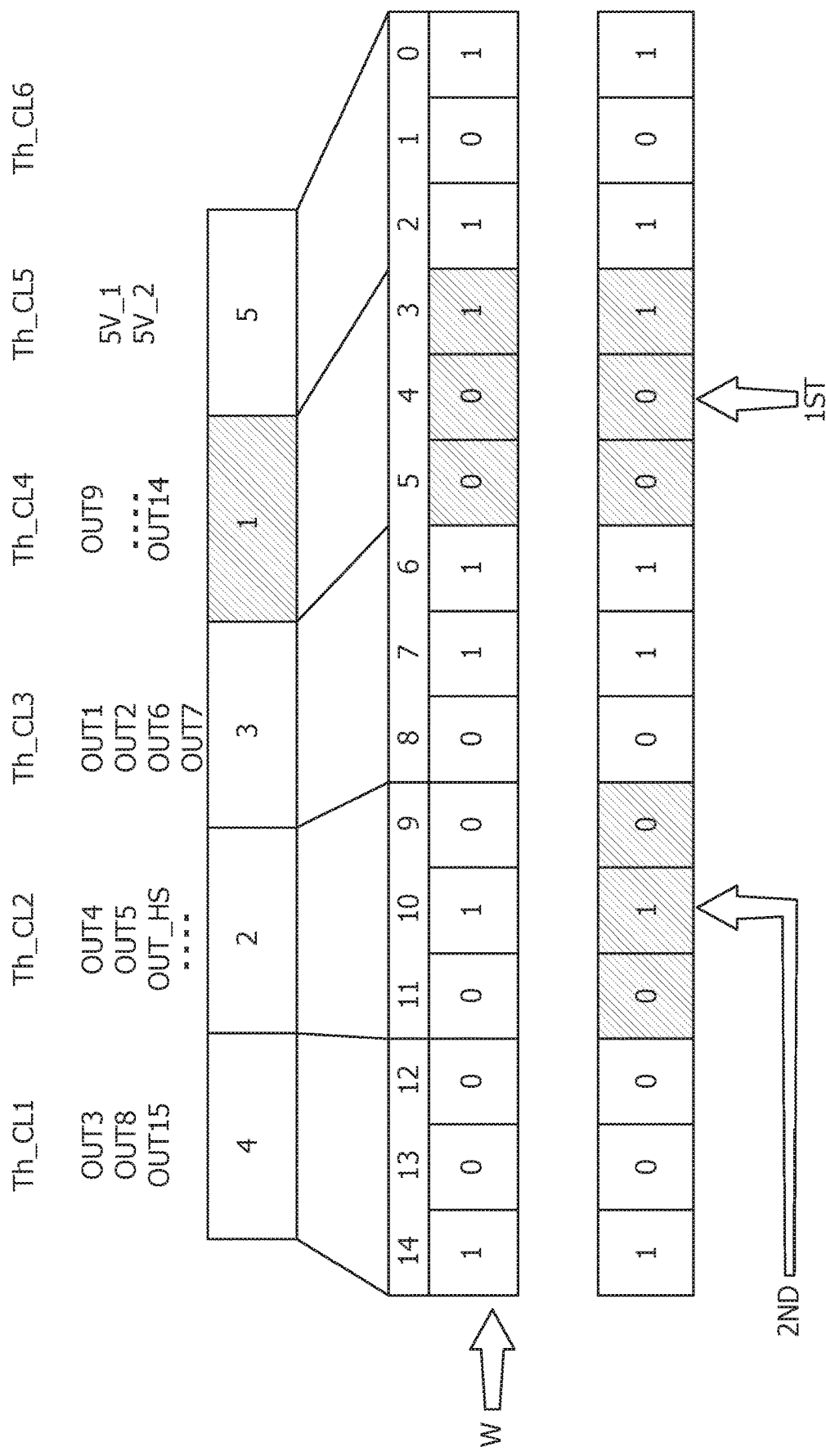
FIG. 5 is a diagram exemplary of possible management of thermal events in one or more embodiments.

The diagram of FIG. 5 is exemplary of one or more embodiments where the concept schematically outlined in FIGS. 2 to 4 with reference to two possible heat sources HB1, HB2 is extended to a plurality of clusters of heat sources designated Th_CL1, Th_CL2, Th_CL3, . . . so on (the clusters in question being possibly in any number).

Figure 6:
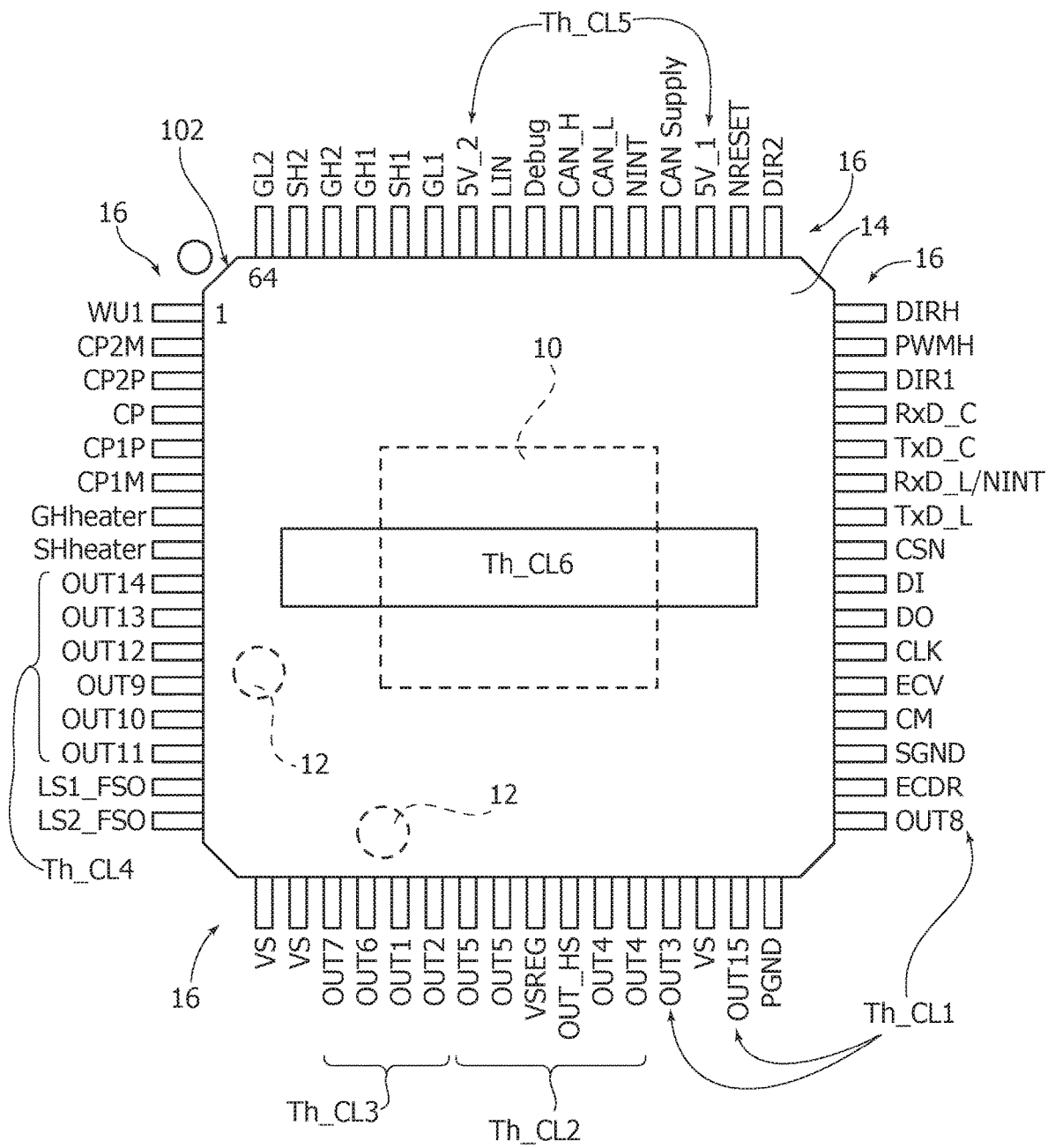
FIG. 6 is an exemplary representation of a semiconductor device according to embodiments.

FIG. 6 is an exemplary representation of a semiconductor device (e.g. an integrated circuit) including a package 14 and various arrays of leads (pins) 16 extending from the package 14. According to standard practice, these pins may be numbered (e.g., 1, . . . , 64) and/or labeled (WU1, CP2M, . . . , SH2, GL2) according to their functions as input and/or output leads.

For the sake of presentation, it may be assumed that a heat-sensitive circuit (e.g., a CPU) 10 together with a shield 120 of thermal sensors 12 may be housed in the package, so that the package 14 may be exemplary of the first temperature domain 102 of FIG. 1, while at least some of the pins 16 may correspond to connections to potential heat sources such as sources HB1, HB2 in FIGS. 2 to 4 arranged around the heat sensitive circuit 10 in FIG. 6.

As schematically shown in FIG. 6, certain ones of the pins 16 (that is, not necessarily all the pins 16) may be associated with respective heat sources whose operation (that is the heat which may be generated by such a source during operation) may affect the heat-sensitive circuit 10 to be protected.

Such pins being "associated" with respective heat sources may mean e.g. that operation of a certain heat source (that is generation of heat by that source) may be mirrored by the appearance of a signal on a certain pin.

In one or more embodiments, this may be because the signal on a certain pin controls operation of a certain heat source, e.g., a certain pin "energizes" a certain heat source located outside the semiconductor device of FIG. 6, or operation of a certain heat source comes together with a signal appearing on a certain pin e.g. because a certain heat source located outside (or inside) the semiconductor device of FIG. 6 "energizes" the pin.

Whatever the operation mechanism leading to such association, in one or more embodiments as schematically illustrated in FIG. 6, the pins in question may be regarded as arranged in clusters corresponding to clusters Th_CL1, Th_CL2, Th_CL3, Th_CL4, Th_CL5 of the associated heat sources, that is in an arrangement wherein at least some of the electrical contact pins 16 are switchable between an activation state and a de-activation state of a heat-generating circuit coupled therewith.

In one or more embodiments, the clusters Th_CL1, Th_CL2, Th_CL3, Th_CL4, Th_CL5 may be defined based on various factors, by e.g. grouping together in a cluster those pins pertaining to a certain function, a certain location in a temperature domain (e.g. 102 in FIG. 1), the associated power consumption/heat generation.

By referring (merely by way of example) to a Door Zone plus Power Management device for use in the automotive field, the various clusters mentioned by way of example in the foregoing may correspond, e.g., to:

5 W driver+mirror y-axis+OUT 15 (Th_CL1),
door lock+OUT_HS (Th_CL2),
10 W driver+folder+mirror x-axis (Th_CL3), high ohmic channels (Th_CL4),
regulated power supplies VREG1, VREG2 (Th_CL5).

In one or more embodiments, a "global" cluster (Th_CL6) may also be defined corresponding to the semiconductor device as a whole.

It will again be appreciated that such partitioning of clusters is presented here merely for exemplary purposes with no limiting effects on embodiments.

The diagram of FIG. 5 is exemplary of the possibility of allotting to the clusters Th_CL1, Th_CL2, Th_CL3, . . . respective weights W in an ordered sequence as represented e.g. by binary numbers 001, 010, 011, . . . .

For example, cluster Th_CL4 may be given a "pole position" by being allotted a binary weight 001 (first in the list—1ST), followed by cluster Th_CL2 with a binary weight 010 (second in the list—2ND), with clusters Th_CL3, Th_CL1, Th_CL5, following in the third, fourth and fifth place in the list with respective binary weights 011, 100 and 101.

In that way, cluster Th_CL4 may be selected e.g. as the "main" or "most critical" source of heat based on the priority list as exemplified in FIG. 5, followed by clusters Th_CL2, Th_CL3, Th_CL1, Th_CL5, with the weight/position of each cluster in the list being adapted to be set by allotting respective priority bits, e.g. via a Serial Peripheral Interface (SPI) associated with the CPU 10.

As schematically represented in the lower portion of FIG. 5, deactivation "priorities" of the various clusters as discussed in the foregoing may lie at the basis of a thermal protection strategy (which may be managed by the CPU 10 itself, that is by the heat-sensitive device to be protected). If over-temperature is detected by one or more sensors 12 in the shield 120 (e.g., within the package 14) the system (e.g., the CPU 10) may switch-off the first cluster 1ST in the list, e.g., the cluster Th_CL4. If over-temperature is found to be still present after the first cluster in the list has been switched off, the system may proceed by switching-off the second cluster 2ND in the list, e.g., the cluster Th_CL2, and so on until all the clusters in the list have been switched-off.

Operation as exemplified in FIG. 5 thus makes it possible to tailor switching-off the heat sources as represented by the clusters Th_CL1, Th_CL2, Th_CL3, . . . in a flexible way (including possibly switching-on again a certain cluster previously switched-off, upon detecting that over-temperature no longer subsists).

Such a thermal management strategy may facilitate, on the one hand, performing an effective thermal protection function (possibly managed by the heat-sensitive circuit 10 to be protected, e.g., an embedded CPU) while avoiding, on the other hand, that certain functions may be unnecessarily switched-off.

One or more embodiments make it possible to define the various clusters and/or their positions in the "priority" list in a smart manner, e.g. as a function of the positions and/or the number of sensors 12 that detect a certain over temperature event, so that switching-off may involve the cluster(s) which are at the basis of the over-temperature event.

Also, the "global" cluster Th_CL6 may be relied upon as a sort of safety-net so that, if a quite serious overheating process is detected (e.g., as sensed by many sensors 12 simultaneously) the system (e.g., CPU 10) may take a very drastic approach by immediately switching-off all the clusters, while in any case preserving some basic (e.g., low-power) functions so that system intelligence is not shut-down completely.

Figure 7:
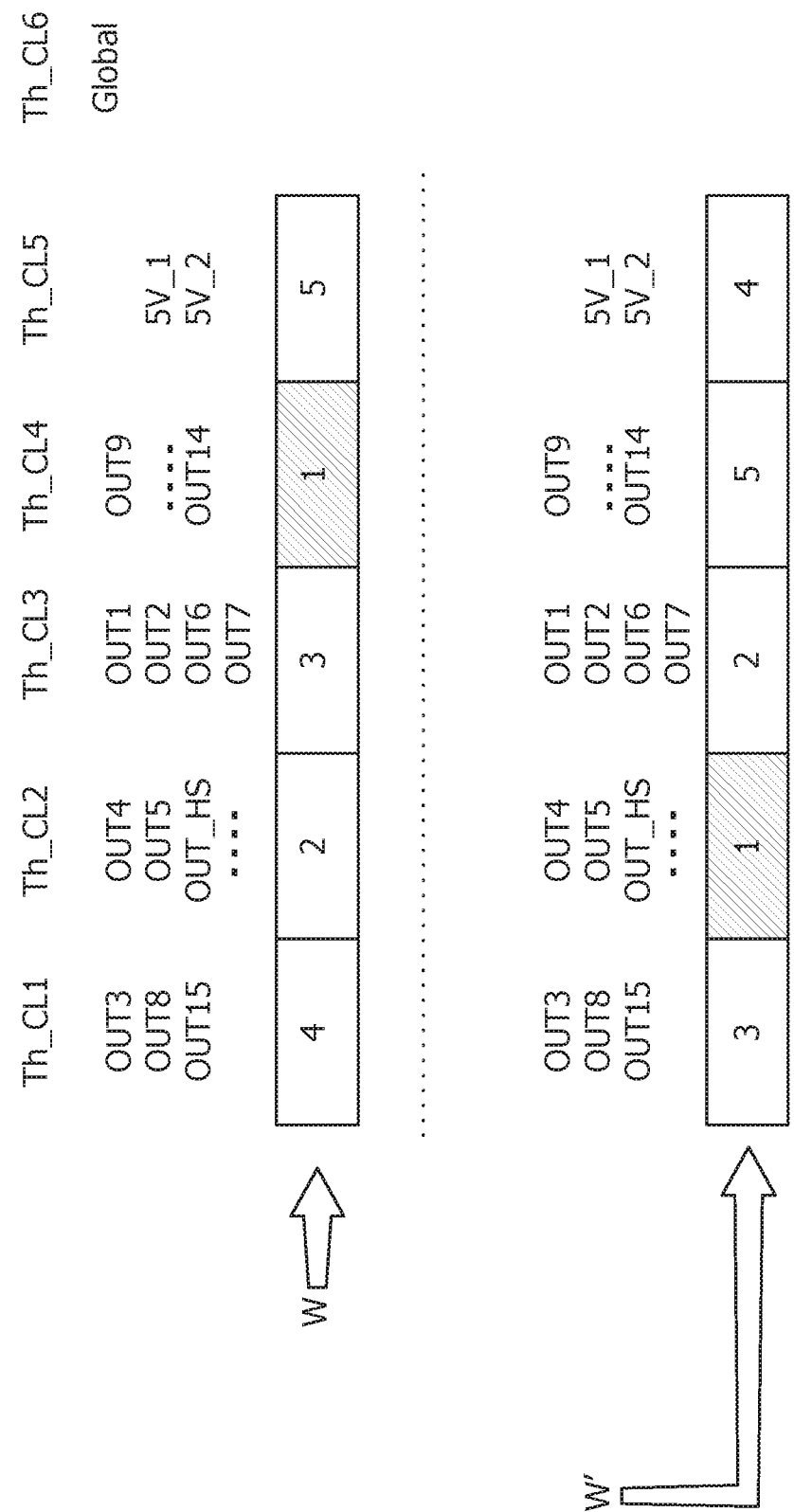
FIG. 7 is a diagram exemplary of possible management of thermal events in one or more embodiments.

FIG. 7 is exemplary of the possibility, in one or more embodiments, of re-arranging the rankings (e.g., positions or weightings) allotted to the various clusters in the list.

For instance, in one or more embodiments, the weights W exemplified in FIG. 5 (these are reproduced in the upper portion of FIG. 7 for immediate reference) may correspond to a user-defined priority list which may be re-arranged to a different list W', e.g., in case a sudden increase in temperature (e.g., 170° C. reached in a few seconds) being detected.

In one or more embodiments, the list W' may embody a default priority such as, e.g., a "power consumption" priority concept, with the various clusters arranged in a descending order of power consumption (the highest consuming cluster first and the lowest consuming cluster last) so that a shut-off may occur following such power consumption priority weights W' in the place of a user-defined priority (based, e.g., on functional priorities) as represented by the weights W.

The flow chart of FIG. 8 is exemplary of possible operation of system as discussed in the foregoing (which may be controlled e.g. by the CPU 10, e.g., by means of Serial Peripheral Interface (SPI) feature to select/modify priority lists such as w or W').

After a start step 1000 (e.g., device turn on), in a step 1002 an internal parameter (e.g., x=1) can be set after which a check is made in a step 1004 as to whether an over-temperature is detected at the shield 120 (e.g. by one or more sensors 12).

In the negative, a further check may be performed in a step 1006 as to whether the temperature detected is much lower than a threshold value Tw (T<<Tw), the threshold being indicative of a potentially dangerous temperature, suggesting close monitoring.

In the presence of a positive outcome of the step 1006 (the temperature detected is much lower than the threshold, thus indicating safe operation of the circuit) operation (turn-on) state of all clusters TH-CL1, . . . can be confirmed in a step 1008 after which the system may evolve back to step 1002 (e.g., by letting a certain monitoring delay lapse before a further check is made at step 1004.

In the case of a negative outcome of a step 1006 (the temperature detected being close to a threshold Tw, thus suggesting a close monitoring) the check of step 1004 may be repeated on a short time basis.

In one or more embodiments, a positive outcome of step 1004 (over-temperature detected at the shield 120) may lead to a further step 1010 where different strategies (that is priorities) may be selected in dealing with over-temperature.

For instance, the step 1010 may involve checking whether protection is on and whether a fast (sudden) increase of temperature has been detected (e.g., 170° C. reached in a few seconds referring to the example made in the foregoing).

If no fast/sudden increase in temperature is detected (negative outcome of step 1010) the over-temperature phenomenon detected in step 1004 may be managed in step 1012 according to a first strategy (e.g., based on a user-defined priority as exemplified by the weights W in FIGS. 5 and 7) so that the first cluster 1ST in the list W (e.g. cluster Th_CL4) may be switched off in a step 1014, while the parameter x increased (e.g., x=x+1) in a step 1016.

The check as to over-temperature may thus be repeated at step 1004 so that (via the possible sequence of a positive outcome of step 1006 and a negative outcome of step 1010) the one or more (further) sources of heat in the list W may be sequentially switched-off in step 1014 with the parameter x possibly further increased as needed.

Conversely, if the check made in step 1010 yields a positive outcome (indicating, e.g., a sudden increase in the temperature at the shield 120) a different strategy (e.g., "power consumption" priority as represented by the weights W' in FIG. 7) may be adopted.

In that way, possible subsequent switching-off of heat sources (e.g., with a step 1014 possibly repeated) may take place based on the priority scheme represented by the weights W' in FIG. 7 in the place of the priority scheme represented by weights W in FIG. 5.

The block 1018 in FIG. 7 is exemplary of a possible check made in order to ascertain if the alternative strategy (e.g., "power consumption" priority) W' has already been adopted—e.g., as a default choice (positive outcome of step 1018). Alternatively, in the case of a negative outcome of step 1018, the alternative strategy is adopted in a step 1020 with the parameter x re-set to the initial value, x=1, so that the new priority scheme W' may be adopted starting from the cluster (e.g., Th_CL2) appearing first in the list W'.

One or more embodiments may thus include a circuit, including a plurality of heat-generating circuits (e.g., HB1, HB2), a heat-sensitive circuit (e.g., 10) exposed to heat generated by the heat-generating circuits, and a distribution of temperature sensors (e.g., 12) along a border line (e.g., 120) between the heat-sensitive circuit and the heat-generating circuits, the sensors generating at least one over-temperature signal as a function of temperature sensed at the border line.

The plurality of heat-generating circuits include clusters (e.g. Th_CL1, . . . , Th_CL6) of heat-generating circuits, the clusters being selectively de-activatable (1014) in at least one ordered sequence (e.g., W, W') of respective de-activation weights as a result of the at least one over-temperature signal being generated by the sensors.

In one or more embodiments, the ordered sequence of respective de-activation weights may be variable (e.g., 1010) between at least one first sequence and at least one second sequence.

In one or more embodiments, the distribution of sensors may be sensitive to a rate of change of the temperature sensed at the border line in excess of a change threshold, the circuit being configured for varying the ordered sequence between the at least one first sequence and the at least one second sequence as a result of a rate of change of the temperature sensed at the border line in excess of the change threshold.

In one or more embodiments, the heat-sensitive circuit may include a processing circuit (e.g. a CPU 10) configured for controlling selective de-activation (e.g. 1014) of the clusters of heat-generating circuits in the at least one ordered sequence of respective de-activation weights.

In one or more embodiments, a method may include providing a circuit including a plurality of heat-generating circuits and a heat-sensitive circuit exposed to heat generated by the heat-generating circuits, sensing at least one over-temperature signal as a function of temperature sensed at a border line between the processing circuit and the heat-generating circuits, and arranging the plurality of heat-generating circuits in clusters of heat-generating circuits by allotting to the clusters respective de-activation weights in at least one ordered sequence. The method may further include selectively de-activating the clusters of heat-generating circuits according to the least one ordered sequence as a result of the at least one over-temperature signal being generated by the sensors.

One or more embodiments of the method may include varying the ordered sequence of respective de-activation weights between at least one first sequence and at least one second sequence.

One or more embodiments of the method may include sensing a rate of change of the temperature sensed at the border line in excess of a change threshold, and varying the ordered sequence between the at least one first sequence and the at least one second sequence as a result of a rate of change of the temperature sensed at the border line in excess of the change threshold.

One or more embodiments of the method may include adopting the second sequence as a default sequence.

In one or more embodiments the second sequence may include clusters of heat-generating circuits arranged in a descending order of power dissipation.

One or more embodiments of the method may include sensing (e.g. at 1004) an over-temperature at the border line, selecting (e.g. at 1012) a first cluster of heat-generating circuits in the ordered sequence, de-activating (e.g. at 1014) the selected cluster of heat-generating circuits, and checking whether the over-temperature remains at the border line. If the over-temperature is found to remain at the border line, the method further includes selecting (e.g. at 1012) at least one further cluster of heat-generating circuits in the ordered sequence, and de-activating the at least one further cluster of heat-generating circuits selected.

In one or more embodiments a semiconductor device may include a substrate (e.g. 100), a semiconductor die on the substrate, the semiconductor die including a heat-sensitive circuit (e.g. 10), and a distribution of temperature sensors on the substrate along a border line in the vicinity of the heat sensitive circuit, the sensors generating at least one over-temperature signal as a function of temperature sensed at the border line. The semiconductor device may further include a device package (e.g. 14) having electrical contact pins (e.g. 16; 1, . . . , 64 in FIG. 6) extending from the package, wherein at least some of the electrical contact pins are switchable between an activation state and a de-activation state of a heat-generating circuit coupled therewith. Additionally included in the semiconductor device may be a processing circuit configured for bringing the at least some of the electrical contact pins to the de-activation state, wherein the clusters of heat-generating circuits are selectively de-activated in the at least one ordered sequence of respective de-activation weights with the method of one or more embodiments.

Without prejudice to the underlying principles, the details and embodiments may vary, even significantly, with respect to what has been described purely by way of example, without departing from the extent of protection.

What is claimed is:

1. A circuit, comprising:
   a plurality of heat-generating circuits;
   a heat-sensitive circuit exposed to heat generated during operation of the plurality of heat-generating circuits;
   a temperature sensor disposed at a location between the heat-sensitive circuit and the plurality of heat-generating circuits, the temperature sensor being configured to generate an over-temperature signal as a function of temperature sensed at the location, wherein the plurality of heat-generating circuits is selectively deactivatable in an ordered sequence based on deactivation weights respectively assigned to the plurality of heat-generating circuits and in response to the over-temperature signal; and a plurality of the electrical contact pins switchable between an activation state and a deactivation state for activating and deactivating the plurality of heat-generating circuits.

2. The circuit of claim 1, wherein the deactivation weights are variable between a first sequence of deactivation weights and a second sequence of deactivation weights.

3. The circuit of claim 2, wherein the temperature sensor is sensitive to a rate of change of temperature at the location in excess of a change threshold, and wherein the ordered sequence is variable based on the first sequence of deactivation weights or the second sequence of deactivation weights and in response to the rate of change of temperature at the location being in excess of the change threshold.

4. The circuit of claim 1, further comprising a processing circuit configured to control a selective deactivation of the plurality of heat-generating circuits in the ordered sequence.

5. The circuit of claim 4, wherein the heat-sensitive circuit comprises the processing circuit.

6. The circuit of claim 1, wherein the heat-sensitive circuit comprises a microcontroller.

7. A method, comprising:
sensing a temperature at a location between a heat-sensitive circuit and a plurality of heat-generating circuits, the heat-sensitive circuit being exposed to heat generated during operation of the plurality of heat-generating circuits;
generating a control signal in response to the temperature sensed at the location; and
using a plurality of contact pins that are switchable from an activation state to a deactivation state, selectively deactivating, in an ordered sequence, the plurality of heat-generating circuits based on deactivation weights respectively assigned to the plurality of heat-generating circuits and in response to the control signal.

8. The method of claim 7, further comprising varying the deactivation weights between a first sequence of deactivation weights and a second sequence of deactivation weights.

9. The method of claim 8, further comprising:
sensing a rate of change of temperature at the location in excess of a change threshold; and
varying the ordered sequence based on the first sequence of deactivation weights or the second sequence of deactivation weights and in response to the rate of change of temperature at the location being in excess of the change threshold.

10. The method of claim 8, further comprising adopting the second sequence of deactivation weights as a default sequence.

11. The method of claim 8, wherein the second sequence of deactivation weights is assigned to the plurality of heat-generating circuits in a descending order of power dissipation.

12. The method of claim 8, wherein selectively deactivating, in the ordered sequence, the plurality of heat-generating circuits based on the deactivation weights respectively assigned to the plurality of heat-generating circuits and in response to the control signal comprises:
sensing the temperature at the location;
selecting at least one first heat generating circuit from the plurality of heat-generating circuits in the ordered sequence based on the deactivation weights respectively assigned to the plurality of heat-generating circuits;
deactivating the at least one first heat-generating circuit while keeping activated other ones of the plurality of heat-generating circuits;

determining whether the temperature remains at the location;
selecting at least one further heat-generating circuits from the other ones of the plurality of heat-generating circuits in the ordered sequence based on the deactivation weights respectively assigned to other ones of the plurality of heat-generating circuits, in response to the temperature remaining at the location; and
deactivating the at least one further cluster of heat-generating circuit.

13. A semiconductor device, comprising:
a substrate;
a semiconductor die on the substrate, the semiconductor die including a heat-sensitive circuit;
a plurality of temperature sensors on the substrate and distributed along a border line in a vicinity of the heat-sensitive circuit, the plurality of temperature sensors generating an over-temperature signal based on a temperature sensed at the border line;
a device package having electrical contact pins extending from the device package, wherein a plurality of the electrical contact pins is switchable between an activation state and a deactivation state for respectively activating and deactivating a plurality of heat-generating circuits; and
a processing circuit configured to bring the plurality of the electrical contact pins to the deactivation state, wherein the plurality of heat-generating circuits is selectively deactivated in an ordered sequence based on deactivation weights respectively assigned to the plurality of heat-generating circuits.

14. The semiconductor device of claim 13, further comprising:
a computer-readable storage medium storing a program to be executed by the processing circuit, the program including instructions for:
sensing, by the plurality of temperature sensors, the temperature at the border line, the heat-sensitive circuit being exposed to heat generated during operation of the plurality of heat-generating circuits;
generating, by the plurality of temperature sensors, the over-temperature signal in response to the temperature sensed at the border line; and
selectively deactivating the plurality of heat-generating circuits in the ordered sequence based on the deactivation weights.

15. The semiconductor device of claim 13, wherein the deactivation weights are variable between a first sequence of deactivation weights and a second sequence of deactivation weights, the first sequence of deactivation weights being configured to cause deactivation of the plurality of heat-generating circuits according to a first ordered sequence, and the second sequence of deactivation weights being configured to cause deactivation of the plurality of heat-generating circuits according to a second ordered sequence.

16. The semiconductor device of claim 13, wherein the deactivation weights are assigned to the plurality of heat-generating circuits in a descending order of power consumption.

17. The semiconductor device of claim 13, wherein the heat-sensitive circuit comprises a microcontroller.

18. The semiconductor device of claim 13, wherein the deactivation weights respectively assigned to the plurality of heat-generating circuits is further assigned to the heat-sensitive circuit.

19. The semiconductor device of claim 18, wherein the heat-sensitive circuit is a last one in the ordered sequence to be selectively deactivated.

20. The semiconductor device of claim 13, wherein the plurality of temperature sensors is further configured to be sensitive to a rate of change of temperature at the border line.

* * * * *